United States Patent [19]

Bhattacharyya et al.

[11] Patent Number: 5,777,265

[45] Date of Patent: Jul. 7, 1998

[54] MULTILAYER MOLDED PLASTIC PACKAGE DESIGN

[75] Inventors: Bidyut K. Bhattacharyya; Debendra Mallik, both of Chandler; Ron Vitt, Phoenix; David B. Kline, Tempe, all of Ariz.

[73] Assignee: Intel Corporation, Santa Clara, Calif.

[21] Appl. No.: 861,242

[22] Filed: May 21, 1997

Related U.S. Application Data

[63] Continuation of Ser. No. 7,246, Jan. 21, 1996, abandoned.

[51] Int. Cl.$^6$ .................... H01L 23/02; H01L 23/48; H01L 23/52
[52] U.S. Cl. .................... 174/52.4; 174/52.2; 361/813; 257/690; 257/691; 257/692; 257/700; 257/750; 257/758; 257/762; 257/773; 257/774; 257/787
[58] Field of Search ............. 174/52.1, 52.2, 174/52.3, 52.4; 437/209, 220, 224; 264/272.11; 257/700, 701, 702, 734, 735, 736, 750, 758, 762, 773, 774, 690–692, 787; 438/121, 123, 125, 106; 361/813

[56] References Cited

U.S. PATENT DOCUMENTS

| | | | |
|---|---|---|---|
| 4,320,438 | 3/1982 | Ibrahim et al. | 361/764 |
| 4,839,717 | 6/1989 | Phy et al. | 257/664 |
| 4,879,588 | 11/1989 | Ohtsura et al. | 257/664 |
| 4,891,687 | 1/1990 | Malik et al. | |
| 4,972,253 | 11/1990 | Palino et al. | 257/691 |
| 4,980,034 | 12/1990 | Volfson et al. | 205/122 |
| 5,008,734 | 4/1991 | Dutta et al. | 257/693 |
| 5,012,386 | 4/1991 | McShane et al. | 361/386 |
| 5,158,912 | 10/1992 | Kellerman et al. | 437/218 |
| 5,235,209 | 8/1993 | Shimuzu et al. | 257/692 |
| 5,235,211 | 8/1993 | Hamburgen | 257/758 |
| 5,258,575 | 11/1993 | Beppu et al. | 174/52.4 |
| 5,264,729 | 11/1993 | Rostoker et al. | 257/774 |
| 5,272,590 | 12/1993 | Hernandez | 361/306.2 |
| 5,311,057 | 5/1994 | McShane et al. | 257/676 |
| 5,331,511 | 7/1994 | Lee et al. | 361/713 |

*Primary Examiner*—Bot L. Ledynh
*Attorney, Agent, or Firm*—Blakely, Sokoloff, Taylor & Zafman

[57] ABSTRACT

A multi-layer integrated circuit package which contains layers of dielectric that substantially reduce metal migration between the metal conductors of the package. The package has metal baseplates that are separated from a lead frame by a plurality of dielectric tapes. The integrated circuit is mounted to the baseplate which has a plurality of tabs that are connected to the lead frame of the package. The power or ground leads of the package are bonded to the corresponding baseplate through the tabs of the metal plate. The lead frame, metal baseplate and dielectric tapes all have center openings to provide clearance for the integrated circuit. The center opening of the tapes are such that the dielectric material extends beyond the ends of the baseplates and lead frame.

6 Claims, 4 Drawing Sheets

MULTILAYER MOLDED PLASTIC PACKAGE DESIGN

This is a Continuation Application of application Ser. No. 08/007,246, filed Jan. 21, 1993, abandoned.

BACKGROUND OF THE INVENTION

1. Field of the Invention

The present invention relates to an electronic package for an integrated circuit.

2. Description of Related Art

U.S. Pat. Nos. 4,835,120 and 4,891,687 issued to Mallik et al. disclose a multi-layer molded plastic electronic circuit that has a pair of metal plates which couple an integrated circuit to the lead frame of the package. The plates are typically connected to the power and ground pins of the integrated circuit and the corresponding leads of the lead frame. The power and ground planes lower the inductance of the leads without increasing the number of pins in the package.

The multi-layer Mallik package is constructed with alternating layers of dielectric tape and metal plates. The tape is typically constructed from a polyimide that is covered with an adhesive. The adhesive is heated under pressure to bond the polyimide to the metal plates. It has been found that the polyimide produces an acidic by-product during the process of attaching the polyimide to the lead frame of the package. The acidic by-product acts as an electrolyte which induces metal migration between the metal plates. During package assembly, a gap is sometimes created between the metal plates. The gap creates an electrolytic path that is parallel with the electric field of the adjacent conductive plates. Providing a parallel path and a gap increases the rate of metal migration between the metal plates. Additionally, the adhesive may flow down the flexible tape and create a medium for metal migration. It would be desirable to have a multi-layer integrated circuit package that is not susceptible to metal migration between the conductors of the package.

SUMMARY OF THE INVENTION

The present invention is a multi-layer integrated circuit package which contains layers of dielectric that substantially reduce metal migration between the metal conductors of the package. The package has a metal baseplate that is separated from a lead frame by a dielectric tape. The integrated circuit is mounted to the baseplate which has a pair of tabs that are connected to the lead frame of the package. The power or ground pins of the package are bonded to the baseplate and coupled to the lead frame through the tabs of the metal plate. The lead frame and dielectric tape both have center openings to provide clearance for the integrated circuit. The center opening of the tape is smaller than the opening of the lead frame, so that the dielectric material extends beyond the ends of the lead frame.

The present invention insures that no gaps are created between the conductors and prevents a continuous adhesive path between the metal layers. The oversized tape also creates an electrolytic barrier between the lead frame and metal plate which is partly perpendicular to the electric field of the conductors, thereby reducing the metal migration between the metal members. The tape is constructed from a material that does not produce acidic by-products which may induce metal migration between the lead frame and baseplate of the package.

Therefore it is an object of the present invention to provide a multi-layer integrated circuit package that substantially reduces any metal migration between the metal conductors of the package.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
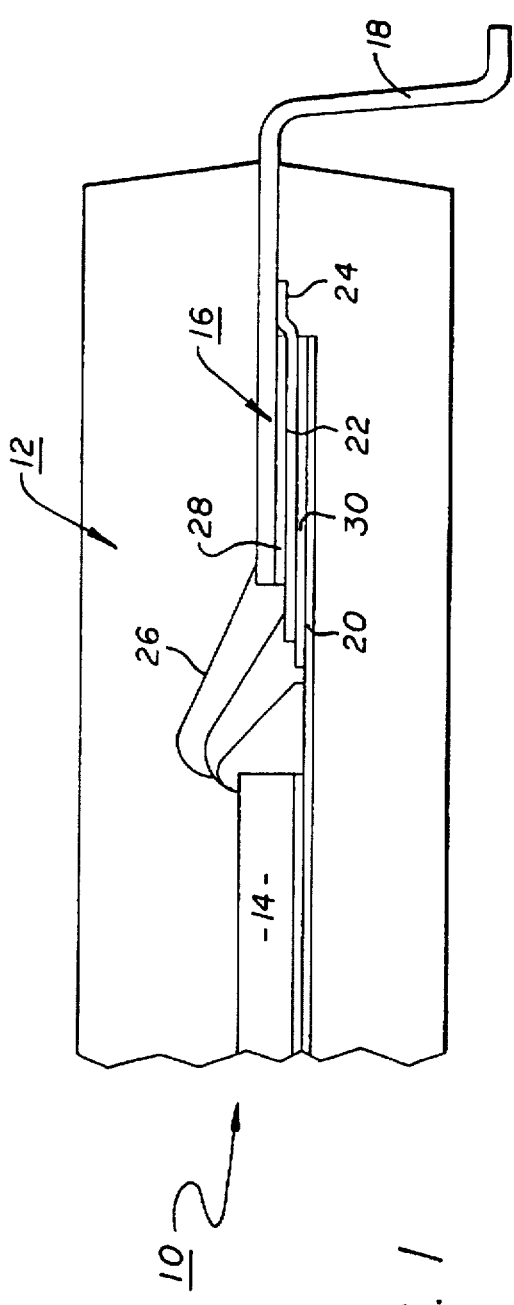
FIG. 1 is a cross-sectional view of a multi-layer package of the present invention.

Referring to the drawings more particularly by reference numbers, FIG. 1 shows a multi-layer package 10 of the present invention. The package 10 is similar to the multi-layer package disclosed in U.S. Pat. Nos. 4,891,687 and 4,835,120 issued to Mallik et al, which are hereby incorporated by reference. The package 10 has an outer housing 12 that encapsulates an integrated circuit 14. The housing 12 is typically constructed by transfer molding plastic around the IC 14. The integrated circuit 14 is coupled to a lead frame 16 which has leads 18 that extend from the housing 12. The leads 18 are typically soldered to a printed circuit board (not shown).

The integrated circuit 14 is mounted to a first baseplate 20 that is attached to the housing 12. Located between the first baseplate 20 and the lead frame 16 is a second baseplate 22. The baseplates are coupled to corresponding leads 18 of the lead frame 16 by tabs 24. The integrated circuit 14 is coupled to the lead frame 16 and baseplates by wire bonds 26. The baseplates are typically constructed from copper and provide a conductive plane for the integrated circuit 14. By way of example, the ground pins of the integrated circuit 14 may be connected to the first baseplate 20 and coupled to the leads of the lead frame 16 that are dedicated to ground. The power pins of the integrated circuit 14 may be connected to the second baseplate 22 and coupled to the leads of the lead frame 16 that are dedicated to power. The signal lines of the circuit 14 may be coupled directly to the leads 18 of the lead frame 16. The inclusion of the power/ground planes decreases the inductance of the power supply and reduces the noise of the digital signals that are transmitted between the integrated circuit 14 and the lead frame 18 of the package 10.

Figure 2:
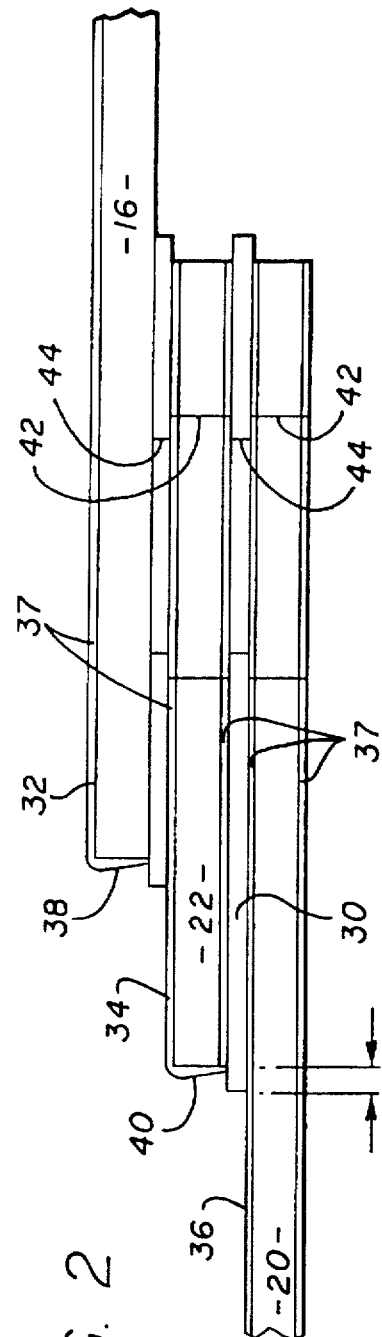
FIG. 2 is an enlarged cross-sectional view of the package of FIG. 1.

As shown in FIG. 2, the second baseplate 22 is separated from the lead frame 16 by a first layer of dielectric 28, and separated from the first baseplate 20 by a second layer of dielectric 30. The layers of dielectric 28 and 30 are typically constructed from a material that will not produce any acidic by-products when attached to the metal baseplates. In the preferred embodiment, the dielectric is a tape comprising a polyimide base film that is covered by a phenolic adhesive which contains N-Butyl Rubber. Each dielectric polyimide tape is sold by Ube Corporation under the trademark Upilex SSH. The adhesive is sold under the trademark RXF LP. The tape assembly is preferably 0.0028 inches thick. A 0.002 inch thick polyimide tape that has both surfaces covered with a 0.0004 inch thick adhesive. A 0.002 inch thick tape creates a long electrolytic path that reduces the possibility of metal migration between the baseplates.

The lead frame 16 and the baseplates each have landing zones 32-34 that are typically plated with silver 37. The landing zones provide an area on which the wire bonds 26 are attached to the metal conductors back away from adhesive edge. The silver is preferably plated to a point under the adhesive tape. Plating the silver 37 to a point under the tape prevents bulges on the metal near the end of the tape. The bulges may cause the tape adhesive to flow around the end of the tape during the bonding process. It had been found that plating only the ends of the leads and baseplates, created bulges in the lead frame 16 and baseplates due to the thickness of the silver plating. The silver bulges caused the adhesive of the dielectric tape to flow around the end of the tape during assembly due to the excessive bonding pressures in the bulged area of the metal members.

The dielectric tape is constructed so that the tape extends beyond the edges of the metal conductors. As shown in FIG. 2, the first dielectric tape 28 extends beyond the edge 38 of the lead frame 16 and the second dielectric tape 30 extends beyond the edge 40 of the second baseplate 22. In the preferred embodiment the dielectric layers extend beyond the conductors by a minimum of 0.001 inches. Such an overlap insures that gaps will not be created between the metal layers after the assembly, or during the use, of the package. The extended dielectric prevents a direct adhesive path between the metal layers. The overlapping dielectric also creates an electrolytic path that is initially perpendicular to the electric field of the conductors. The perpendicular portion of the electrolytic path reduces the possibility of metal migration between the conductors.

The baseplates and tape may each have via holes 42 and 44, respectively. The via holes 42 and 44 allow the plastic of the housing to flow through the dielectric and metal layers during the molding process. Once cooled, the plastic within the via holes create tabs that connect the top of the housing with the bottom of the housing. The via holes 44 of the dielectric are preferably smaller than the via holes 42 of the baseplates. The smaller dielectric holes greatly reduce metal migration for the reasons discussed above.

Figure 3:
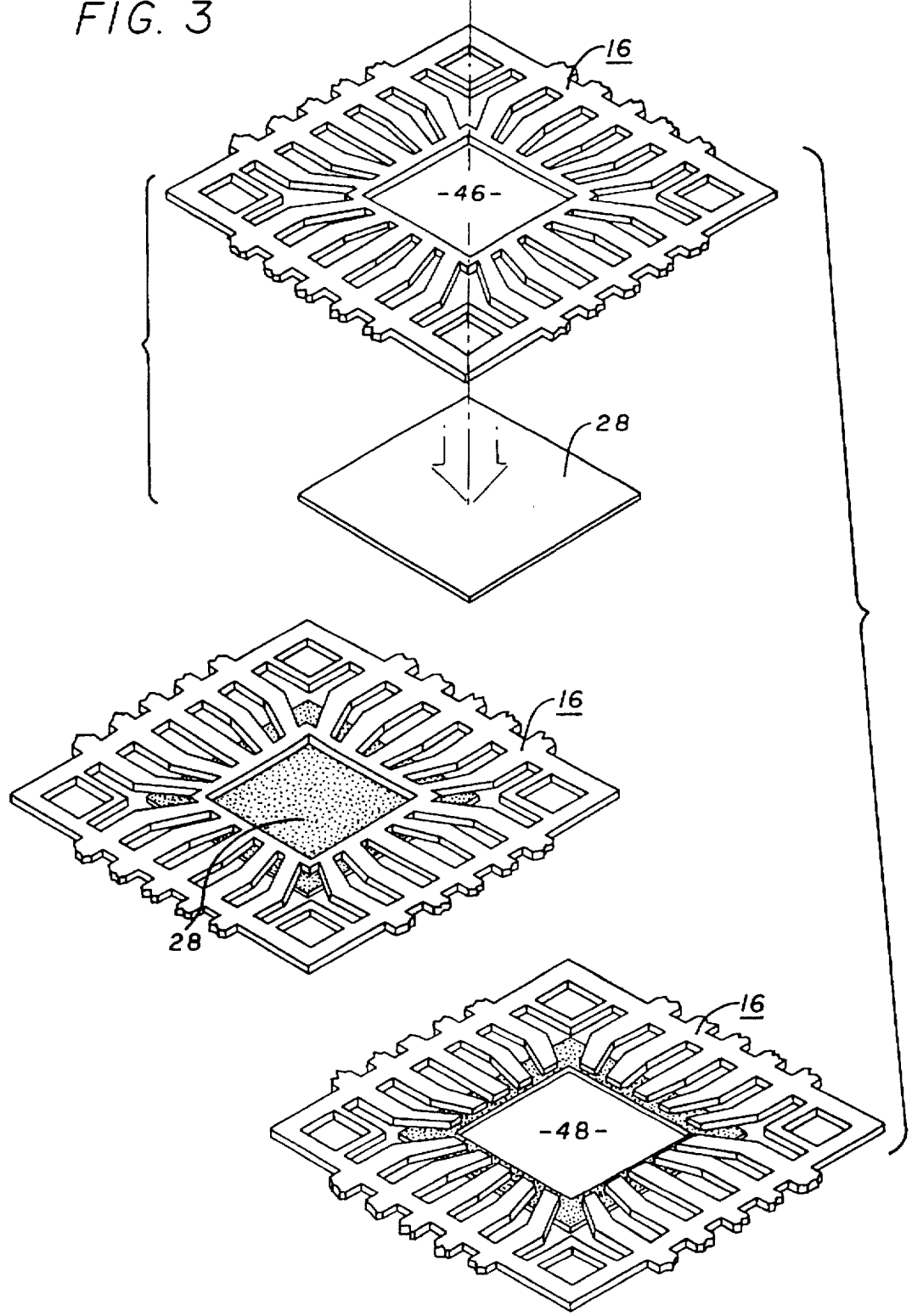
FIG. 3 is a perspective view showing a dielectric tape being attached to a lead frame.
Figure 4:
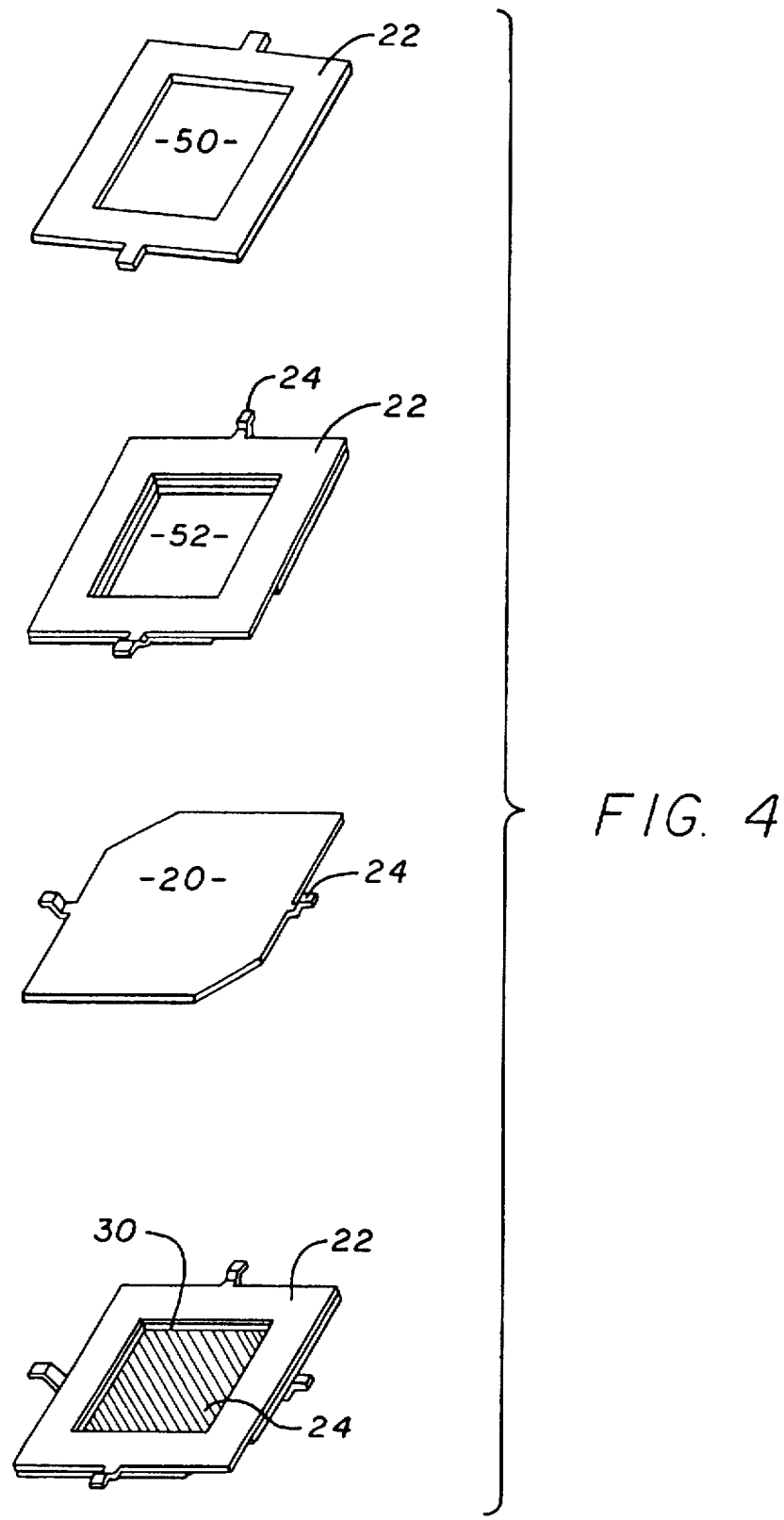
FIG. 4 is a perspective view showing a first baseplate being coupled to a second baseplate by a dielectric tape.
Figure 5:
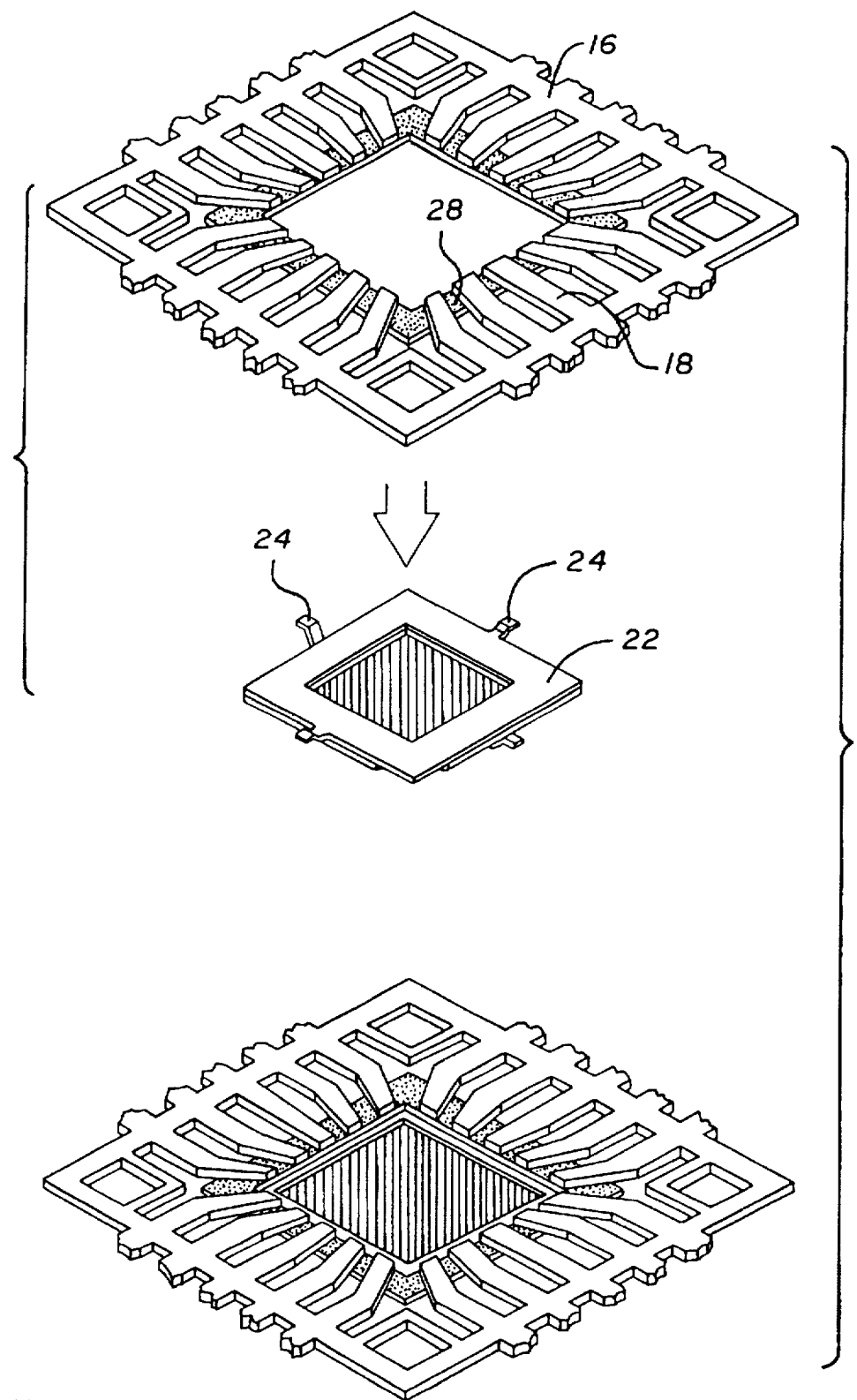
FIG. 5 is a perspective view showing the baseplates being attached to the lead frame.

FIGS. 3-5 show a method for constructing the package 10 of the present invention. The baseplates and lead frame are initially plated with silver. The first dielectric tape 28 is bonded to the lead frame 16, so that the tape covers a center opening 46 of the frame 16. A center opening 48 is then created in the first tape 28. The center opening 48 of the tape 28 is smaller than the center opening 46 of the lead frame 16, so that the dielectric extends past the edges of the leads 18.

As shown in FIG. 4, the second dielectric tape 30 is bonded to the second baseplate 22, which has a center opening 50. A center opening 52 is then cut into the second tape 30. The center opening 52 of the tape 30 is smaller than the center opening 50 of the second baseplate 22, so that the tape 30 extends past the inner edges of the baseplate 22. The first baseplate 20 is then attached to the second layer of dielectric 30.

As shown in FIG. 5, the second baseplate 22 is then coupled to the first dielectric tape 28 of the lead frame 16. The tabs 24 of the baseplates are also attached to corresponding leads 18 of the lead frame 16. As shown in FIG. 1, the integrated circuit 14 is mounted to the first baseplate 20 and wire bonded to the lead frame 16 and plates 20 and 22. The circuit 14, lead frame 16 and plates 20 and 22 are encapsulated by the outer housing 12 and the outer portion of the lead frame are then separated from the rest of the frame, to create the individual leads of the package. The present invention provides a multi-layer package that greatly reduces metal migration that was found to occur in packages in the prior art.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package for an integrated circuit, comprising:

a first baseplate;

a lead frame that has a lead frame edge;

a second baseplate located between said first baseplate and said lead frame, said second baseplate having a second baseplate edge;

a first dielectric layer located between said second baseplate and said lead frame, said first dielectric layer having a first dielectric layer edge which extends beyond said lead frame edge;

a second dielectric layer located between said first baseplate and said second baseplate and second dielectric layer having a second dielectric layer edge that extends beyond said second baseplate; and, a layer of plating that extends form said second baseplate edge to a point under said first dielectric layer.

2. The package as recited in claim 1, wherein said first baseplate has a first baseplate via hole with a first baseplate via hole diameter and said first dielectric layer has a first dielectric via hole that is essentially concentric with said first baseplate via hole and which has a first dielectric via hole diameter that is less than said first baseplate via hole diameter.

3. The package as recited in claim 1, wherein said first and second baseplates have first and second baseplate via holes with first and second baseplate via hole diameters, respectively, and said first and second dielectric layers have first and second dielectric via holes that are essentially concentric with said baseplate via holes and which have first and second dielectric via hole diameters that are less than said baseplate via hole diameters.

4. The package as recited in claim 1, wherein said first dielectric layer is constructed from a material that does not produce an acidic by-product.

5. A multilayer electronic package for an integrated circuit, comprising:

a first baseplate that has a first baseplate via hole with a first baseplate via hole diameter;

a lead frame that has a lead frame edge;

a second baseplate located between said first baseplate and said lead frame, said second baseplate having a second baseplate edge and a second baseplate via hole with a second baseplate via hole diameter;

a first dielectric layer between said second baseplate and said lead frame, said first dielectric layer having a first dielectric layer edge which extends beyond said lead frame edge, said first dielectric layer further having a first dielectric via hole that is essentially concentric with said baseplate via holes and which has a first dielectric via hole diameter that is less than said baseplate via hole diameters;

a second dielectric layer between said first and second baseplates, said second dielectric layer having a second dielectric layer edge which extends beyond said second baseplate edge, said second dielectric layer further having a second dielectric via hole that is essentially concentric with said baseplate via holes and which has a second dielectric via hole diameter that is less than said baseplate via hole diameters; and, a layer of plating that extends from said second baseplate edge to a point under said first dielectric layer.

6. The package as recited in claim 5, wherein said dielectric layers are constructed from a material that does not produce an acidic by-product.

* * * * *